United States Patent
Dhayni

(10) Patent No.: US 9,577,769 B2
(45) Date of Patent: Feb. 21, 2017

(54) BUILT-IN SELF-TEST TECHNIQUE FOR DETECTION OF IMPERFECTLY CONNECTED ANTENNA IN OFDM TRANSCEIVERS

(71) Applicant: ST-Ericsson SA, Plan-les-Ouates (CH)

(72) Inventor: Achraf Dhayni, Vallauris (FR)

(73) Assignee: OPTIS CIRCUIT TECHNOLOGY, LLC, Plano, TX (US)

( * ) Notice: Subject to any disclaimer, the term of this patent is extended or adjusted under 35 U.S.C. 154(b) by 0 days.

(21) Appl. No.: 14/419,298

(22) PCT Filed: Jul. 31, 2013

(86) PCT No.: PCT/EP2013/066054
§ 371 (c)(1),
(2) Date: Feb. 3, 2015

(87) PCT Pub. No.: WO2014/037160
PCT Pub. Date: Mar. 13, 2014

(65) Prior Publication Data
US 2015/0180595 A1   Jun. 25, 2015

Related U.S. Application Data

(60) Provisional application No. 61/704,001, filed on Sep. 21, 2012.

(30) Foreign Application Priority Data

Sep. 4, 2012  (EP) ..................................... 12306053
May 29, 2013 (EP) ..................................... 13169645

(51) Int. Cl.
H04B 3/00    (2006.01)
H04B 7/216   (2006.01)
(Continued)

(52) U.S. Cl.
CPC .............. *H04B 17/19* (2015.01); *H04B 17/14* (2015.01); *H04B 17/15* (2015.01); *H04J 4/005* (2013.01);
(Continued)

(58) Field of Classification Search
CPC .......... H04J 11/00; H04J 1/00; H04J 11/0079; H04J 4/005
(Continued)

(56) References Cited

U.S. PATENT DOCUMENTS 4,425,666 A * 1/1984 Groth, Jr. ................ H04L 27/10
341/54
5,457,719 A * 10/1995 Guo ........................ H03K 5/135
327/2

(Continued)

FOREIGN PATENT DOCUMENTS

DK  EP177532     * 10/2005
EP  1 777 532 A1   4/2007
(Continued)

OTHER PUBLICATIONS

International Search Report issued in corresponding International application No. PCT/EP2013/066054, date of mailing of report Sep. 12, 2013.
(Continued)

*Primary Examiner* — Daniel Washburn
*Assistant Examiner* — Sarah Hassan
(74) *Attorney, Agent, or Firm* — The Danamraj Law Group, P.C.; Thomas L. Crisman; Kenneth A. McClure

(57) ABSTRACT

An OFDM communication transceiver, which is configured to test its connection with an antenna circuit unit, has a receiver chain and an emitting chain. The receiver chain includes a time-to-frequency transform unit and the emitting chain includes a frequency-to-time transform unit. The
(Continued)

transceiver further includes means for disconnecting the receiver chain to the antenna circuit unit, means for providing a stimulus as input to the emitting chain, means for reintroducing the signal at the output of the emitting chain as an input of the receiving chain, means for determining a circuit resonance frequency, Fr, and a quality factor, Q, of a transfer function computed from the output of the time-to-frequency transform unit, and means for deciding about the connection of said antenna circuit unit according to the resonance frequency and the quality factor.

14 Claims, 1 Drawing Sheet

(51) Int. Cl.
| | |
|---|---|
| H04B 17/19 | (2015.01) |
| H04J 4/00 | (2006.01) |
| H04L 7/02 | (2006.01) |
| H04B 17/14 | (2015.01) |
| H04J 11/00 | (2006.01) |
| H04B 17/15 | (2015.01) |
| G01R 31/3187 | (2006.01) |
| H04B 17/17 | (2015.01) |
| H04B 17/18 | (2015.01) |

(52) U.S. Cl.
CPC ............... *H04J 11/00* (2013.01); *H04L 7/02* (2013.01); *G01R 31/3187* (2013.01); *H04B 17/17* (2015.01); *H04B 17/18* (2015.01)

(58) Field of Classification Search
USPC .................................. 375/257, 260; 370/335
See application file for complete search history.

(56) References Cited

U.S. PATENT DOCUMENTS

| | | | | |
|---|---|---|---|---|
| 6,081,162 | A * | 6/2000 | Johnson | H03K 5/2481 327/65 |
| 6,901,126 | B1 * | 5/2005 | Gu | H03L 7/0998 375/354 |
| 7,236,060 | B2 * | 6/2007 | Wood | H03B 5/1852 327/291 |
| 2001/0026179 | A1 * | 10/2001 | Saeki | H03K 5/131 327/147 |
| 2002/0009170 | A1 * | 1/2002 | Schmatz | H03L 7/07 375/371 |
| 2003/0038659 | A1 * | 2/2003 | Takahashi | H03L 7/089 327/141 |
| 2004/0042504 | A1 * | 3/2004 | Khoury, Jr. | H04L 7/02 370/518 |
| 2005/0134305 | A1 * | 6/2005 | Stojanovic | H04L 25/028 326/31 |
| 2007/0072562 | A1 | 3/2007 | Yang | |
| 2007/0211808 | A1 * | 9/2007 | Kang et al. | 375/260 |
| 2007/0291735 | A1 * | 12/2007 | Fidler et al. | 370/352 |
| 2012/0294338 | A1 * | 11/2012 | Zhan et al. | 375/219 |

FOREIGN PATENT DOCUMENTS

| | | |
|---|---|---|
| EP | 2 570 818 A1 | 3/2013 |
| WO | 2010/049853 A1 | 5/2010 |

OTHER PUBLICATIONS

Extended European Search Report issued in corresponding European application No. EP 13 16 9645, date of completion of the search Sep. 3, 2013.

* cited by examiner

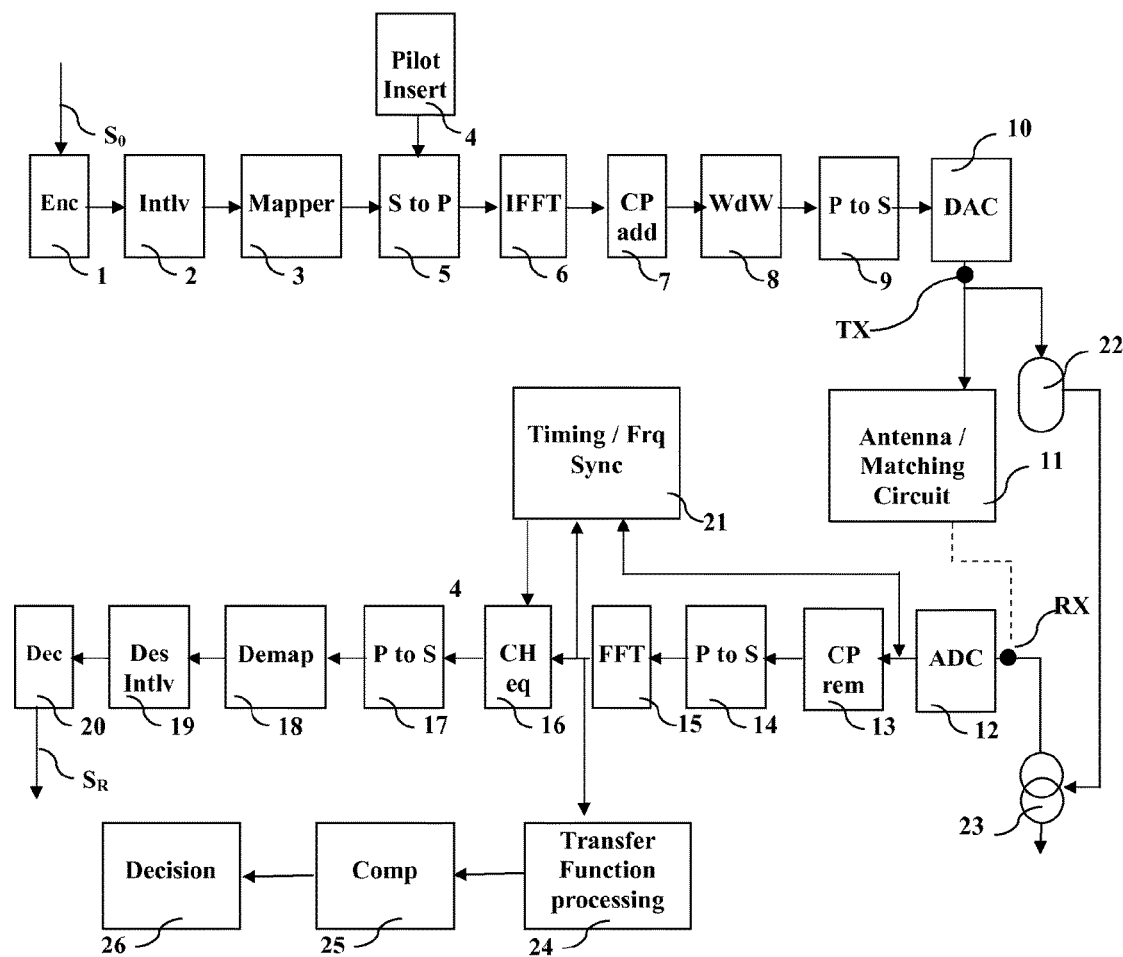

BUILT-IN SELF-TEST TECHNIQUE FOR DETECTION OF IMPERFECTLY CONNECTED ANTENNA IN OFDM TRANSCEIVERS

FIELD OF THE INVENTION

The invention relates to the field of self-test of antennas in wireless communication systems and more particularly in multicarrier communication systems like Orthogonal Frequency-Division Multiplexing (OFDM) systems.

BACKGROUND OF THE INVENTION

Due to manufacturing needs, mobile phone manufacturers use mechanical structure where the antenna circuit (i.e. the physical antenna and its matching and filtering circuits) is connected to the phone handset with spring contacts, instead of soldering for instance.

Badly connected antenna spring contact may cause a situation where the phone works somehow in locations where the mobile network's coverage is strong (big cities, etc.) and poorly in the country side or in any locations where the network's coverage is low (lower signal strength).

This situation is very hard to detect even by the end user. Plus, even in the case where the end user detects a bad behavior of his or her mobile phone handset, s/he will bring it to a service center where usually the network coverage is strong. The service center clerk will then not be able to notice any problems with the mobile phone (unless the antenna circuit is completely disconnected).

There is therefore a need for automatic testing mechanisms, usually referred to as Built-In Self Test (BIST) techniques or production tests.

Various production test and BIST techniques have been developed to test the antenna circuit presence in microelectronic transceivers. Generally speaking, they all fall in one of the following categories.

A first prior art category consists in measuring the impedance of the antenna circuit. Using a peak detector that is integrated in the power amplifier block of the transmitter, the peak voltage of the transmitted signal is measured on-chip. By measuring this peak voltage, the load impedance at the antenna circuit connection pads can be calculated and compared with a predetermined range of admissible values so as to check whether the antenna circuit is present (well soldered) or not.

A second prior art category consists in measuring the output power of the transmitter. The device is programmed to radiate at a known power and then a spectrum analyzer measures the really outputted power (taking into account antenna-to-antenna loss over the air). By comparing these 2 values, a connection default of the antenna circuit can be detected. This technique requires extra equipment like a spectral analyzer and its associated antenna, and is therefore more devoted to production test than to BIST.

A third prior art category consists in measuring the signal, or the signal to noise ratio (SNR) of the receiver. A continuous wave signal is radiated to the antenna of the receiver and the resulting signal level and frequency offset are measured using an on-chip DFT in the receiver circuit. A measured input power below the transmitted value, or a measured frequency offset higher than a predetermined one means that the antenna circuit is not well connected. This approach requires extra equipment like an RF signal generator and its associated antenna. Like the previous one, it is therefore more devoted to production test than to BIST.

A fourth category of prior art consists in performing a receiver/transmitter loopback test. This technique is for instance used in TM transceiver. The transmitter output a frequency modulated single tone carrier (for example, set at 87.5 MHz). The antenna voltage is fed through a matched attenuator to the internal LNA input. At the output of the LNA, the signal strength is measured by a level detector. The measured value is then compared to a lower limit. In case the measured value is above the limit, the antenna circuit is considered to be ok. If the measure value is below the lower limit, then the antenna circuit is considered as being in default. This mechanism is based on the fact that when a bad quality factor caused by the absence of the antenna circuit attenuates the transmitted signal level, the received signal strength has a lower value.

However, these solutions are insufficient in detecting a defective antenna mechanical contact. One of the reasons is that unlike traditional defective soldered contacts, a defective antenna's mechanical contact (e.g. spring contact) does usually not change substantially the impedance. Notice that mechanical contacts is the general case, spring contacts is an example of a widely spread way of doing mechanical contacts.

There is a need for a solution permitting to detect automatically connection defaults of non-soldered antenna circuits, e.g. antenna circuits connected with spring contacts.

SUMMARY OF THE INVENTION

An object of embodiments of the present invention is to alleviate at least partly the above mentioned drawbacks.

This is achieved with a method for testing the connection of an antenna circuit unit to an OFDM communication transceiver having a receiver chain and an emitting chain, said receiver chain comprising a time-to-frequency transform unit and said emitting chain comprising a frequency-to-time transform unit, said method consisting in Disconnecting said receiver chain to said antenna circuit unit;

Providing a stimulus as input to said emitting chain;

Reintroducing the signal at the output of said emitting chain as an input of said receiving chain;

Determining a resonance frequency and a quality factor of a transfer function computed from the output of said time-to-frequency transform unit;

Deciding about the connection of said antenna circuit unit and said OFDM communication transceiver according to said resonance frequency and said quality factor.

According to embodiments of the invention, the method can comprise one or several of the following features:

said stimulus is provided so that a same complex value is applied to all inputs of said frequency-to-time transform unit;

the clock of said OFDM communication transceiver is set faster than in normal operations, so as to increase the bandwidth of said signal at the output of said emitting chain;

said clock is set 5 times faster than in normal operations;

reintroducing said signal at the output of said emitting chain as an input of said receiving chain consists in down-scaling and mirroring the current at the output of said emitting chain to the input of said receiving chain;

said deciding comprises comparing said resonance frequency and said quality factor to predetermined tolerance intervals.

said deciding comprises comparing said resonance frequency or said quality factor to predetermined tolerance intervals.

Another aspect of the invention concerns a computer program product comprising a computer readable medium, having thereon a computer program comprising program instructions, the computer program being loadable into a data-processing unit and adapted to cause execution of the method previously described, when the computer program is run by the data-processing unit.

Another aspect of the invention concerns an OFDM communication transceiver having a receiver chain and an emitting chain, adapted to test its connection with an antenna circuit unit, said receiver chain comprising a time-to-frequency transform unit and said emitting chain comprising a frequency-to-time transform unit, said OFDM communication transceiver further comprising:

Means for disconnecting said receiver chain to said antenna circuit unit;

Means for providing a stimulus as input to said emitting chain;

Means for reintroducing the signal at the output of said emitting chain as an input of said receiving chain;

Means for determining a resonance frequency and a quality factor of a transfer function computed from the output of said time-to-frequency transform unit;

Means for deciding about the connection of said antenna circuit unit and said OFDM communication transceiver according to said resonance frequency and said quality factor.

According to embodiments of the invention, the method can comprise one or several of the following features:

said stimulus is provided so that a same complex value is applied to all inputs of said frequency-to-time transform unit;

the OFDM communication transceiver further comprises means for setting its clock faster than in normal operations, so as to increase the bandwidth of said signal at the output of said emitting chain;

said clock is 5 times faster than in normal operations;

said means for reintroducing the signal at the output of said emitting chain as an input of said receiving chain comprises a current mirror adapted for down-scaling and mirroring the current at the output of said emitting chain to the input of said receiving chain;

said means for deciding are adapted for comparing said resonance frequency and said quality factor to predetermined tolerance intervals;

said means for deciding are adapted for comparing said resonance frequency or said quality factor to predetermined tolerance intervals.

BRIEF DESCRIPTION OF THE DRAWINGS

FIG. 1 shows a flowchart of a method for testing the connection of an antenna circuit unit to an OFDM communication transceiver, in accordance with an embodiment of the invention;

DETAILED DESCRIPTION OF EMBODIMENTS OF THE INVENTION

The invention consists in testing the presence (or good connection) of the antenna circuit from a different point of view than the existing techniques. The self-test is performed by measuring on-chip the quality factor and/or the resonance frequency of the antenna circuit, rather than testing the impedance, the frequency offset and/or the signal strength like the prior art solutions.

As it has been said, with non-soldered contacts, the impedance, the power etc. are not good criteria for checking the quality of the contact.

On the opposite, the applicant has considered that a defective antenna spring contact detunes the resonance of the antenna circuit and/or changes its quality factor.

In addition:

Detuning the resonance of the antenna circuit causes a nonlinear gain in the bandwidth of the received and transmitted signals. Under certain conditions (poor network), this drives the circuit to a faulty behavior without changing the overall gain of the signal.

Changing the quality factor causes different transient times in the received and transmitted signals. Under certain conditions (very strong or very weak signals), this drives the circuit to a faulty behavior without any systematic change in the load impedance and/or the power of the signal For these reasons, it is not possible to cover this kind of faulty contacts by applying test methods relying on impedance or power measurements or frequency offset measurement, as the ones mentioned above.

On the other side, when the antenna circuit is perfectly connected, the signal frequencies at the output of the transmitter near the resonance frequency are amplified according to the quality factor of the antenna circuit, and the frequencies away from the resonance frequency are attenuated according to this same quality factor.

This behavior is characterized by a transfer function (frequency response) seen at the output of the transmitter.

According to the invention, it is taken benefit of this behavior by measuring this transfer function in to order to extract The resonance frequency value (Fr), and/or, The quality factor value (Q).

According to an embodiment of the invention, if these two values are within predetermined ranges of values, the antenna circuit is determined as perfectly connected; if no, the antenna circuit is considered as not perfectly connected. In the latter case, actions can be triggered, like warning the end user by actuating the man-machine interface of the transmitter device.

A particular embodiment of the invention is based on the usage of Fourier Transform functions, in order to generate the high quality stimulus and to do the response processing for measuring on-chip the transfer function (frequency response) of the antenna circuit. Once the transfer function is measured on-chip, the resonance frequency and quality factor are calculated from it.

The Fourier transform functions can be implemented in various ways within the transceiver.

OFDM transceivers have already such functions implemented so as to perform the OFDM transmission. The BIST technique according to the invention can therefore be easily applied to OFDM transceiver by re-using their DFT (Discrete Fourier Transform) and IDFT (Inverse Discrete Fourier Transform) units that are already present.

The FIG. 1 illustrates such an OFDM transceiver. It comprises a transmission part (above) and a reception part (below).

The signal $S_0$ to be transmitted is inserted in a transmission chain made of several chained functional units, namely an encoder unit 1, an interleaver unit 2, a mapper unit 3, a pilot insertion unit 4, a serial-to-parallel transform unit 5, a frequency-to-time transform unit (or Inverse Fourier Transform) 6, a cyclic extension addition unit 7, a windowing 8, a parallel-to-serial transform unit 9, and a digital-to-analog converter (DAC) unit 10. Then the signal to be transmitted is fed in the antenna circuits, which comprise the antenna and matching circuit unit 11.

On the reception part, a similar chain is usually implemented comprising a Analog-to-Digital converter unit 12, a Cyclic extension remover unit 13, a parallel-to-serial transform unit 14, time-to-frequency transform unit (or Fourier Transform, FFT) 15, a Timing and Frequency Synchronization and channel extension unit 21, a Channel equalizer unit 16, a parallel-to-serial unit 17, a de-mapper 18, a bit des-interleaver 19, and a decoder 20. A decoded received signal $S_R$ can then be provided to other circuits of the transceiver.

This functional architecture can be compliant with the state-of-the-art functional architectures and the above-mentioned functional unit will not be described with full details here as the man skilled in the art is knowledgeable about them.

The frequency-to-time transform unit 6 is generally implemented by an inverse Fast Fourier Transform IFFT. This IFFT unit 6 splits the transmission chain into two subparts:

A frequency domain, upstream,
A time domain, downstream.

Similarly, the time-to-frequency unit 15 is generally implemented by a Fast Fourier Transform FFT. This FFT unit 15 splits the transmission chain into two subparts:

A time domain, upstream,
A frequency domain, downstream.

According to the invention, a stimulus is generated by providing a signal $S_0$ in the emitting chain.

The data source can be programmed such that the transmitter generates a wideband test signal by applying the same complex value at all the inputs of the IFFT unit 6. The amplitude of the complex value must be such that the transmitted signal amplitude is 15 dB lower the −1 dB compression point of the transmitter. This is in order to generate a clean stimulus that is pure from nonlinear imperfections. The phase of the complex value can be arbitrarily chosen to be zero.

Taking the WLAN 802.11a/g standard as an example, the stimulus generated has a bandwidth of 20 MHz. This figure is provided by multiplying the length of the Fourier transform (64) by the space between 2 subsequent subcarriers frequencies (312 kHz). This bandwidth is not wide enough. In this example, the stimulus bandwidth must be at least 100 MHz, because the transfer function seen at the output of the emitter (TX) needs to be measured with a span of 100 MHz around the transmitter carrier frequency. It is in this interval where the resonance must be found to calculate the quality factor.

This 100 MHz figure is partly determined by simulation or experiments and allows a good visibility to detect the shift of the frequency resonance. The more visibility is required, the wider should be the frequency span.

For this reason, the digital part of the transceiver can be clocked 5 times faster in frequency that the clocks' frequency in normal operations. This divides by 5 the duration of the time-domain signal at the output of the IFFT unit 6. The bandwidth of the generated stimulus gets then multiplied by 5, so as to become 5×20 MHz=100 MHz, which satisfies the above mentioned wideband constraint.

An emitter to receiver loop-back is also implemented, between the Tx and Rx interfaces.

This can be done by a current mirror 23 which mirrored a down-scaled version of the Tx current to the Rx input. Scaling down is required because the transmitted signal level is higher than the dynamic range of the Rx input which is the LNA (Low Noise Amplifier) input.

The current mirror 23 can be triggered by a switch 22. The switch 22 is closed when the BIST mode is activated. In normal operation, the switch 22 is open so that the radiated signal is only transmitted over the air by the antenna circuits unit 11 and not reintroduced back to the receiver chain at the Rx interface.

In the BIST mode, the antenna circuits unit 11 is not connected to the Rx interface. The ADC unit 12 has only the reintroduced current as input.

The OFDM receivers comprise thus means for disconnecting the receiver chain to the antenna circuit unit 11, and to reconnect them when the BIST mode is terminated and when the OFDM receiver is switched back to normal operations mode.

Then, a transfer function processing unit 24 takes as input the output of the FFT unit 15 to determine the resonance frequency Fr and the quality factor Q.

Indeed, the frequency-domain N samples at the output of the FFT unit 15 represent an attenuated version (by the scaling down explained above) of the transfer function seen at the output of the Tx. (N being equal to 64 in an 802.11a/g implementation).

According to an embodiment of the invention, the resonance frequency Fr or the quality factor Q can be determined according to well-known techniques accessible to the man skilled in the art. This value can then be fed to a comparison unit 25, which compare them it predetermined tolerance intervals or thresholds. According to the results of this comparison, a decision can be taken by a decision unit 26, regarding whether the antenna circuits unit 11 is well connected or not to the Tx interface.

According to another embodiment of the invention, the resonance frequency Fr and the quality factor Q can be determined according to well-known techniques accessible to the man skilled in the art. These values can then be fed to a comparison unit 25, which compare them it predetermined tolerance intervals or thresholds. According to the results of these comparisons, a decision can be taken by a decision unit 26, regarding whether the antenna circuits unit 11 is well connected or not to the Tx interface.

In the general case, the second embodiment is preferable as it allows detection of a larger range of connection defaults.

The connection default can imply only a parasitic capacitance or parasitic impedance. Such a problem impacts only the resonance frequency fr.

The connection default can imply only a parasitic resistance. This impacts the bandwidth and therefore the quality factor Q which is directly linked to it.

Both connection defaults can be cumulated. This is for instance the case when the antenna is completely disconnected. In such a situation, both the quality factor and the resonance frequency are impacted.

It can be tolerated small variations of the quality factor and/or of the resonance frequency fr around their nominal values. For this reason, the comparison unit 25 is adapted to compare the values previously determined by the transfer function processing unit 24 with predetermined tolerance intervals.

From these comparisons, a decision can be taken about the connection of the antenna with the OFDM receiver.

When both the resonance frequency fr and the quality factor Q are taken into account, a decision can be taken when at least one of them violates its respective tolerance interval. In other words, if the resonance frequency fr or the quality factor is too much shifted from the normal value, it can be decided that the antenna is not well connected.

According to embodiments of the invention, the decision can trigger actions dependent of the extent of this misconnection. For instance, a warning can be displayed to the user of the OFDM transceiver with an indication representative of this extent.

As mentioned above, the computation of the resonance frequency fr and of the quality factor Q can be performed according to well-known techniques.

The resonance frequency fr is the frequency at which the signal is at its maximum. Then lower frequency f1 and higher frequency f2 can be determined as corresponding to signal's energy which is half of the energy of the signal at the resonance frequency fr. They corresponds also to a signal amplitude at −3 dB, compared with the signal amplitude at the resonance frequency fr.

The two frequencies f1, f2 determines a bandwidth Δf. The quality factor Q is defined as the ratio of the resonance frequency fr by the bandwidth:

$$Q = \frac{f_r}{\Delta f}$$

It should be mentioned that the BIST mechanism should normally be performed after the TX and Rx circuits have passed their production tests. This is because the Tx and Rx circuits must be guaranteed to be functional so that the determination of bad values of the quality factor Q and/or the resonance frequency Fr can be assumed to be caused by the antenna circuits unit 11 and not by the Rx and Tx circuits themselves.

This BIST mechanism presents numerous advantages, including:
It is fully on-chip. No external circuits need to be plugged or connected for testing the antenna circuits. It can be even transparent to the end user.
It adds only a limited analog overhead that is assumed to be acceptable (current mirror with down-scaling capability and a faster clock for the digital modem).
Negligible digital overhead.
It can detect faults that can only become apparent when the network is weak. It can then help detecting in advance future potential problems.
It is the most accurate method to test the good assembly of the off-chip antenna circuits after being soldered or fixed (by mechanical structures) to the on-chip transceiver circuits.
The concept can be generalized to be applied to any OFDM transceiver that contains an on-PCB (printed circuit board) antenna circuit.
Very high fault detection can be achieved.

The invention has been described with reference to preferred embodiments. However, many variations are possible within the scope of the invention.

The invention claimed is:

1. A method for testing a connection of an antenna circuit unit to an orthogonal frequency-division multiplexing, OFDM, communication transceiver having a receiver chain and an emitting chain, said receiver chain including a time-to-frequency transform unit and said emitting chain including a frequency-to-time transform unit, said method comprising:
   disconnecting said receiver chain from said antenna circuit unit;
   providing a stimulus as an input to said emitting chain;
   reintroducing a signal output by said emitting chain as an input of said receiving chain;
   determining a resonance frequency, Fr, and a quality factor, Q, of a transfer function computed from an output of said time-to-frequency transform unit; and
   deciding about the connection of said antenna circuit unit and said OFDM communication transceiver according to said resonance frequency, Fr, and said quality factor, Q.

2. The method according to claim 1, wherein said stimulus is provided so that a same complex value is applied to all inputs of said frequency-to-time transform unit.

3. The method according to claim 1, wherein a clock of said OFDM communication transceiver is set faster than in normal operations, so as to increase a bandwidth of said signal at an output of said emitting chain.

4. The method according to claim 3, wherein said clock is set five times faster than in the normal operations.

5. The method according to claim 1, wherein said reintroducing of said signal output by said emitting chain as the input of said receiving chain includes down-scaling and mirroring a current output by said emitting chain at the input of said receiving chain.

6. The method according to claim 1, wherein said deciding comprises comparing said resonance frequency, Fr, and said quality factor, Q, to predetermined tolerance intervals.

7. The method according to claim 1, wherein said deciding comprises comparing at least one of said resonance frequency, Fr, and said quality factor, Q, with respective predetermined tolerance intervals.

8. A non-transitory computer readable medium storing a computer program comprising program instructions, the computer program being loadable into a data-processing unit and adapted to cause execution of the method according to claim 1, when the computer program is run by the data-processing unit.

9. An orthogonal frequency-division multiplexing, OFDM, communication transceiver configured to test a connection thereof with an antenna circuit unit, the OFDM communication transceiver comprising:
   a receiver chain including a time-to-frequency transform unit;
   an emitting chain including a frequency-to-time transform unit;
   a switch placed and configured to disconnect said receiver chain from said antenna circuit unit;
   a current mirror configured to provide a signal output by said emitting chain upon receiving a stimulus, as an input of said time-to-frequency transform unit;
   a transfer function processing and comparator configured to determine a resonance frequency, Fr, and a quality factor, Q, of a transfer function computed from an output of said time-to-frequency transform unit of the receiver chain; and
   a decision unit connected to said a transfer function processing and comparator and configured to decide about the connection of said antenna circuit unit and said OFDM communication transceiver according to said resonance frequency, Fr, and said quality factor, Q.

10. The OFDM communication transceiver according to claim 9, wherein said stimulus is provided so that a same complex value is applied to all inputs of said frequency-to-time transform unit.

11. The OFDM communication transceiver according to claim 9, wherein when receiving said stimulus, the receiver chain operates faster than in normal operations, so as to increase a bandwidth of said signal by said emitting chain.

12. The OFDM communication transceiver according to claim 9, wherein said transfer function processing and comparator is configured to compare said resonance frequency, Fr, and said quality factor, Q, to predetermined tolerance intervals.

13. The OFDM communication transceiver according to claim 9, wherein said transfer function processing and comparator is configured to compare at least one of said resonance frequency, Fr, and said quality factor, Q, with respective predetermined tolerance intervals.

14. The OFDM communication transceiver according to claim 11, wherein said clock is five times faster than in the normal operations.

* * * * *